(12) United States Patent
Tang et al.

(10) Patent No.: US 12,549,134 B2
(45) Date of Patent: Feb. 10, 2026

(54) NON-CONTACT SENSING NODE, SYSTEMS AND METHODS OF REMOTE SENSING

(71) Applicant: CASE WESTERN RESERVE UNIVERSITY, Cleveland, OH (US)

(72) Inventors: Xinyao Tang, Cleveland Heights, OH (US); Soumyajit Mandal, Gainesville, FL (US); Tayfun Ozdemir, Ann Arbor, MI (US)

(73) Assignees: CASE WESTERN RESERVE UNIVERSITY, Cleveland, OH (US); VIRTUAL EM INC., Ann Arbor, MI (US)

( * ) Notice: Subject to any disclaimer, the term of this patent is extended or adjusted under 35 U.S.C. 154(b) by 1023 days.

(21) Appl. No.: 17/481,574

(22) Filed: Sep. 22, 2021

(65) Prior Publication Data

US 2022/0094305 A1 Mar. 24, 2022

Related U.S. Application Data

(60) Provisional application No. 63/081,625, filed on Sep. 22, 2020.

(51) Int. Cl.
*H03F 1/02* (2006.01)
*A61B 5/00* (2006.01)
(Continued)

(52) U.S. Cl.
CPC ............ *H03F 1/0266* (2013.01); *A61B 5/28* (2021.01); *A61B 5/7225* (2013.01); *H03F 1/26* (2013.01);
(Continued)

(58) Field of Classification Search
CPC ........ H03F 1/0266; H03F 1/26; H03F 1/3288; H03F 2200/171; H03F 3/45475; A61B 5/28; A61B 5/7225; A61B 5/725
See application file for complete search history.

(56) References Cited

U.S. PATENT DOCUMENTS

2009/0167324 A1* 7/2009 Prance ................. G01R 15/165
324/658
2014/0213882 A1* 7/2014 Chung ................. A61B 5/0006
600/372

(Continued)

OTHER PUBLICATIONS

L. Atallah, et al.; "Unobtrusive ECG Monitoring in the Nicu Using a Capacitive Sensing Array"; IOP Publishing—Institute of Physics and Engineering in Medicine Physiol. Meas. 35 (2014) 895-913; Apr. 17, 2014; 20 pgs.

(Continued)

*Primary Examiner* — Charles A Marmor, II
*Assistant Examiner* — Severo Antonio P Lopez
(74) *Attorney, Agent, or Firm* — Tarolli, Sundheim, Covell & Tummino LLP

(57) ABSTRACT

An example sensing system includes a non-contact sensing electrode configured to sense an electric potential and provide a sensor signal at an output of the sensing electrode based on the sensed electric potential. The output of the sensing electrode is coupled to a first input of an amplifier. The amplifier is configured to provide an amplified output signal representative of at least one measured biosignal based on the sensor signal and a feedback signal provided to the second input of the amplifier. A compensation signal generator is coupled between the output of the amplifier and the second input. The compensation signal generator is configured to estimate corresponding noise and provide the feedback signal to include a filtered signal representative of the estimated noise to the second input to the corresponding noise at the first input of the amplifier and mitigate saturation of the amplifier.

12 Claims, 9 Drawing Sheets

(51) Int. Cl.
*A61B 5/28* (2021.01)
*H03F 1/26* (2006.01)
*H03F 1/32* (2006.01)

(52) U.S. Cl.
CPC ..... *H03F 1/3288* (2013.01); *H03F 2200/171* (2013.01)

(56) References Cited

U.S. PATENT DOCUMENTS

| | | | | |
|---|---|---|---|---|
| 2016/0262703 | A1* | 9/2016 | Maccallum | A61B 5/302 |
| 2016/0344352 | A1* | 11/2016 | Chang | H03F 3/45197 |
| 2018/0263521 | A1* | 9/2018 | Stordopoulos | A61B 5/316 |
| 2019/0036489 | A1* | 1/2019 | Zou | H03F 1/26 |

OTHER PUBLICATIONS

Matthias Steffen, et al.; "Mobile Noncontact Monitoring of heart and Lung Activity"; IEEE Transactions on Biomedical Circuits and Systems, vol. 1, No. 4, Dec. 2007; 8 pgs.

D. Shao et al., "Noncontact Monitoring of Blood Oxygen Saturation Using Camera and Dual-Wavelength Imaging System," in IEEE Transactions on Biomedical Engineering, vol. 63, No. 6, pp. 1091-1098, Jun. 2016, doi: 10.1109/TBME.2015.2481896.

Uenoyama, M., Matsui, T., Yamada, K. et al. Non-contact respiratory monitoring system using a ceiling-attached microwave antenna. Med Bio Eng Comput 44, 835-840 (2006). https://doi.org/10.1007/s11517-006-0091-8.

Y. M. Chi, T. Jung and G. Cauwenberghs, "Dry-Contact and Noncontact Biopotential Electrodes: Methodological Review," in IEEE Reviews in Biomedical Engineering, vol. 3, pp. 106-119, 2010, doi: 10.1109/RBME.2010.2084078.

Y. Xiao, C. Li and J. Lin, "A Portable Noncontact Heartbeat and Respiration Monitoring System Using 5-GHz Radar," in IEEE Sensors Journal, vol. 7, No. 7, pp. 1042-1043, Jul. 2007, doi: 10.1109/JSEN.2007.895979.

M. Chen et al., "A 400 GO Input-Impedance Active Electrode for Non-Contact Capacitively Coupled ECG Acquisition With Large Linear-Input-Range and High CM-Interference-Tolerance," in IEEE Transactions on Biomedical Circuits and Systems, vol. 13, No. 2, pp. 376-386, Apr. 2019, doi: 10.1109/TBCAS.2019.2895660.

X. Tang and S. Mandal, "Indoor Occupancy Awareness and Localization Using Passive Electric Field Sensing," in IEEE Transactions on Instrumentation and Measurement, vol. 68, No. 11, pp. 4535-4549, Nov. 2019, doi: 10.1109/TIM.2018.2890319.

C. J. Harland, T. D. Clark, and R. J. Prance; "Remote detection of human electroencephalograms using ultrahigh input impedance electric potential sensors"; Appl. Phys. Lett. 81, 3284 (2002); 4 pgs. https://doi.org/10.1063/1.1516861.

Y. M. Chi and G. Cauwenberghs, "Wireless Non-contact EEG/ECG Electrodes for Body Sensor Networks," 2010 International Conference on Body Sensor Networks, 2010, pp. 297-301, doi: 10.1109/BSN.2010.52.

John Mountford, Geiland Porrovecchio, Marek Smid, and Radislav Smid, "Development of a switched integrator amplifier for high-accuracy optical measurements," Appl. Opt. 47, 5821-5828 (2008); 8 pgs.

YY Iossel, et al.; Foreign Technology Division, Wright-Patterson AFB, Book, The Calculation of electrical Capacitance; AD 727198; National Technical Information Service; 1971; 295 pgs.

Rajendra Acharya, U., Paul Joseph, K., Kannathal, N. et al. Heart rate variability: a review. Med Bio Eng Comput 44, 1031-1051 (2006); 21 pgs.; https://doi.org/10.1007/s11517-006-0119-0.

T. J. Sullivan, S. R. Deiss and G. Cauwenberghs, "A Low-Noise, Non-Contact EEG/ECG Sensor," 2007 IEEE Biomedical Circuits and Systems Conference, 2007, pp. 154-157, doi: 10.1109/BIOCAS.2007.4463332.

Fadel Adib, et al.; "Smart Homes that Monitor Breathing and Heart Rate"; CHI '15: Proceedings of the 33rd Annual ACM Conference on Human Factors in Computing Systems; Apr. 18, 2015 pp. 837-846; https://doi.org/10.1145/2702123.2702200.

Tang, et al.; "High-Sensitivity electric Potential Sensors for Non-Contact Monitoring of Physiological Signals"; IEEE Transactions on Measurements and Instrumentation, Oct. 23, 2021; 14 pgs.

\* cited by examiner

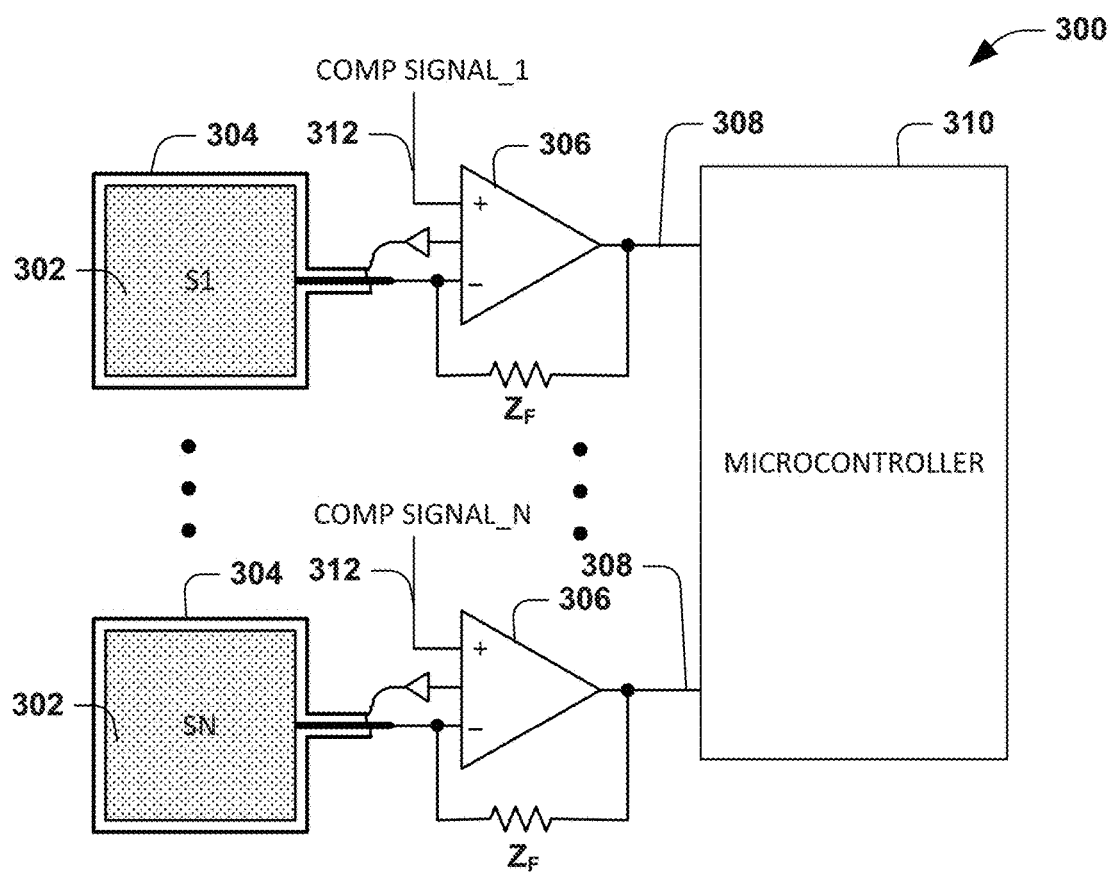
FIG. 7
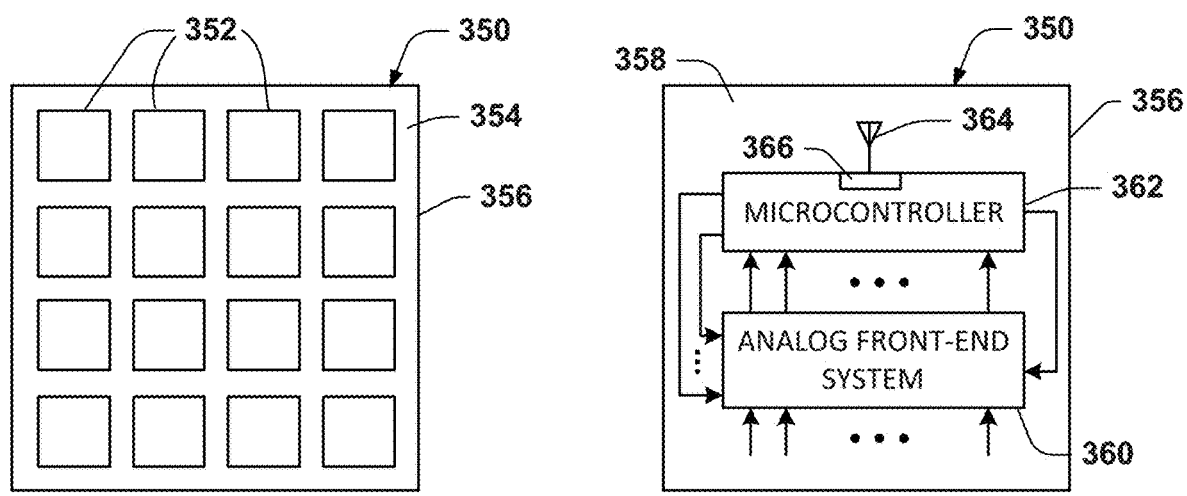
FIG. 8  FIG. 9

NON-CONTACT SENSING NODE, SYSTEMS AND METHODS OF REMOTE SENSING

CROSS-REFERENCE TO RELATED APPLICATION

This application claims the benefit of priority to U.S. provisional patent application 63/081,625, filed Sep. 22, 2020, which is incorporated herein by reference in its entirety.

GOVERNMENT FUNDING

This invention was made with government support under FA8650-19-P-6132 awarded by the Air Force Research Laboratory. The government has certain rights in the invention.

TECHNICAL FIELD

This disclosure relates to a remote sensing node, to a remote sensing system, and to a method of performing remote sensing, such as for measuring one or more biosignals.

BACKGROUND

Biosignals refer to any signal or condition of living beings that can be continually measured and monitored. The term biosignal often refers to bioelectrical signals, but it may refer to both electrical and non-electrical signals. Some examples of biosignals include cardiopulmonary signals, such as respiratory rate (RR), heart rate (HR) as well as to other signals, such as electrical activity in the brain recorded as electroencephalograms (EEG) and in muscles recorded as electromyograms (EMG). Both contact and non-contact sensors have been developed to measure a variety of biosignals. However, many existing non-contact sensing approaches are unable to provide adequate sensitivity or otherwise include unwanted background noise, which renders the measured signals unsuitable for certain applications such as to detect acute events and/or chronic conditions.

SUMMARY

In a described example, a sensing system includes a non-contact sensing electrode configured to sense an electric potential and provide a sensor signal at an output of the sensing electrode based on the sensed electric potential. The output of the sensing electrode is coupled to a first input of an amplifier. The amplifier is configured to provide an amplified output signal representative of at least one measured biosignal based on the sensor signal and a feedback signal provided to the second input of the amplifier. A compensation signal generator is coupled between the output of the amplifier and the second input. The compensation signal generator is configured to estimate corresponding noise and provide the feedback signal to include a filtered signal representative of the estimated noise to the second input to the corresponding noise at the first input of the amplifier and mitigate saturation of the amplifier.

As another example, a non-contact sensing circuit includes a non-contact sensing electrode having a sensing surface and an output, and the sensing electrode adapted to sense an electric potential from a subject. An amplifier has first and second inputs and an output, and the output of the sensing electrode coupled to the first amplifier input. Passive feedback impedance is coupled between the output of the amplifier and the first amplifier input. Compensation signal generator circuitry is coupled between the output of the amplifier and the second amplifier input. The compensation signal generator circuitry can be configured to estimate an indication of power line interference based on an amplified sensor signal at the output of the amplifier and/or estimate an indication of motion noise due to spatial motion of the subject relative to the sensing electrode. The compensation signal generator circuitry is configured to provide a feedback signal to the second amplifier input to reduce noise and enable an increase in a gain of the amplifier based on the passive feedback impedance without saturating an output signal provided by the amplifier. As a result of such configuration, sensitivity of the non-contact sensing circuit is increased.

BRIEF DESCRIPTION OF THE DRAWINGS

FIG. 7 depicts an example of a non-contact sensing system having multiple sensing electrodes.

FIG. 8 depicts an example of a multi-channel non-contact sensing system showing an array of sensing electrodes.

FIG. 9 is another view of the multi-channel non-contact sensing system of FIG. 8 showing circuitry.

DESCRIPTION

This disclosure relates to remote non-contact sensing systems and methods. In an example, the system consists of a physical layer using wireless sensor nodes based on passive electric potential sensing (EPS) that may be sparsely deployed within an environment. One or more sensor nodes may be used to measure biosignals, including cardiopulmonary signals, body motion (e.g., eye blinks, essential tremor), and electrical activity of the heart, brain, and/or muscles. In addition to biosignals, the EPS also allow sensing of indoor occupancy patterns and human crowd dynamics.

Each sensor node includes a non-contact sensing electrode configured to sense an electric potential and provide a sensor signal at an output of the sensing electrode based on the sensed electric potential. The sensing electrode may be implemented as a planar electrode disposed on a substrate, such as a printed circuit board. The sensor signal may be provided to a first input of a differential amplifier. The differential amplifier is configured to provide an amplified output signal representative of at least one electrophysiological signal based on the sensor signal and a feedback signal provided to the second input of the differential amplifier. An adaptive feedback circuit is coupled between the output of the amplifier and a second input of the amplifier. The feedback circuit configured to provide a feedback signal, such as representative of line noise and/or a motion artifact (which is not of interest and hence considered noise) to adaptively cancel corresponding noise at the first input of the amplifier to mitigate saturation of the amplifier. As a result, the sensitivity of the amplifier may be increased to provide a cleaner amplified biosignal while avoiding saturation.

The sensor node may also include a guard electrode that is adaptively driven based on the sensor signal provided by the sensing electrode. The guard electrode may surround at least a substantial portion the sensing electrode and be configured to reduce leakage current at the first input of the amplifier to which the sensor signal is provided. The guard electrode also improves the common mode rejection ratio of the amplifier.

In some examples, each sensor node also includes a microcontroller (MCU) for on-board signal processing and power management. Each sensor node further may include a low-power radio for wireless networking with a local base station (e.g., a wireless gateway). Information acquired from the sensor nodes thus may be communicated from the gateway to a cloud server (or other backend system) that is programmed to execute additional processing that may include deep learning algorithms for statistical verification, data fusion, and high-level feature extraction.

Figure 1:
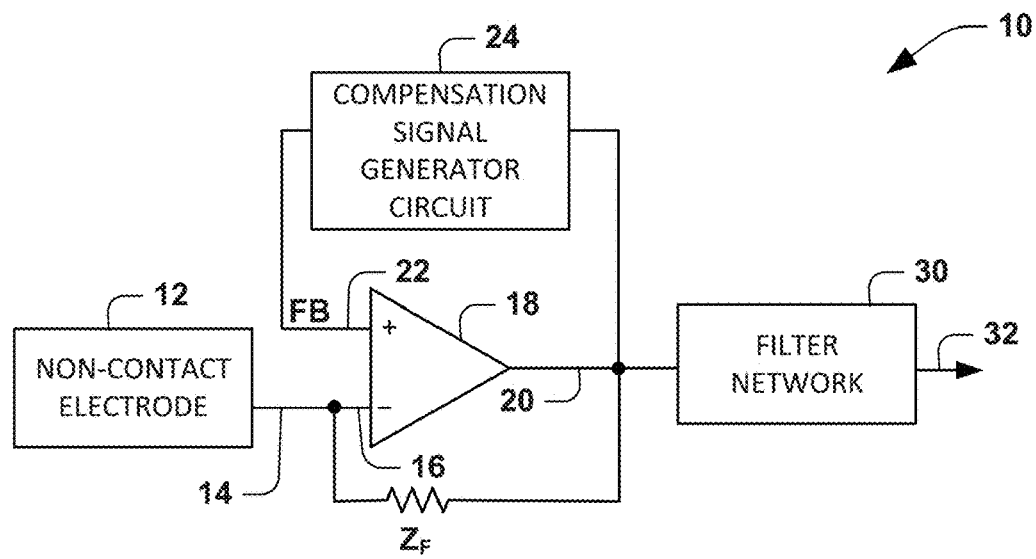
FIG. 1 depicts an example of a non-contact sensing system.

FIG. 1 depicts an example of a non-contact sensing system 10. The system 10 includes a non-contact sensing electrode 12 configured sense an electric potential and provide a sensor signal at an output 14 of the sensor based on the sensed electric potential. For example, the electric potential is measured from the body of an animal (e.g., human) subject. The non-contact sensing electrode 12 includes one or more electrodes having a sensing surface configured as a passive electric field sensor or a passive electric potential sensor. The sensor output 14 is coupled to an input 16 of an amplifier 18. In an example, electrostatic shielding can be placed along the sides and back side of the electrode and a guard electrode can be placed along a perimeter of a top (sensing) surface of the electrode to reduce both leakage current and unwanted signal components (e.g., line noise and other electromagnetic interference) in the sensor signal provided at 16.

The amplifier 18 is configured to provide an amplified output signal at an output 20 thereof based on signals received at respective inputs 16 and 22 of the amplifier 18. The signal at 16 is the electric potential sensed by the sensing electrode 12 and the signal at 22 is a feedback signal (FB) from a compensation signal generator circuit 24. As described herein, the compensation signal generator circuit 24 provides the compensation signal FB at 22 to reduce unwanted signal components (e.g., noise and other signal artifacts) from the amplified output signal at 20. A feedback impedance $Z_F$ is coupled between the input 16 and output 20 of the amplifier 18. The amplified output signal at 20 thus is representative of one or more biosignals (e.g., electric potential) sensed by the non-contact electrode 12.

In the example of FIG. 1, the system 10 includes the compensation signal generator circuit 24 coupled between the output 20 and the input 22 of the amplifier 18. The compensation signal generator circuit 24 may be implemented using analog circuitry, digital circuitry or a combination of analog and digital circuitry (see, e.g., FIGS. 2 and 3). A filter network 30 has an input coupled to the amplifier output 20. The filter network 30 includes one or more filter stages configured to filter the amplified output provided at 20 and produce one or more filtered biosignals at output 32. For example, the filter network 30 can be configured to remove residual unwanted signal components from the amplified output signals. The filter network 30 can also include one or more passive filter stages to extract one or more biosignals of interest from the amplified output signal. For example, the filter network 30 is configured to extract one or more of electrocardiogram (ECG) waveforms from the heart (or electromyogram (EMG) waveforms from other muscles), respiration cycle (RC) waveforms, electroencephalograph (EEG) waveforms and the like.

In an example, the amplifier 18 is implemented as a trans-impedance amplifier having a gain set based on the value of the feedback impedance $Z_F$. For example, the trans-impedance amplifier 18 includes one or more operational amplifiers (op-amps) having $Z_F$ coupled between the output 20 and inverting input 16. For example, the op-amp 18 is configured to have low input bias current and current noise, low voltage noise power spectral density and a low offset voltage. Examples of op-amps that can be used to implement the amplifier 18 include the LMP7721 (available from Texas Instruments Incorporated) and the ADA-4530-1 (available from Analog Devices, Inc.).

Because the system 10 includes multiple stages configured to implement active and passive cancellation methods, the feedback impedance can have a higher value than existing approaches without saturating the amplifier. For example, $Z_F$ can be implemented as a resistance having a value that is greater than or equal to 100 GΩ, such as 150 GΩ or higher. In some examples, a capacitor $C_F$ having a small capacitance (e.g., less than 0.1 pF, such as 0.01 pF or less) can be coupled in parallel with the resistor $R_F$ to provide the feedback impedance $Z_F$. In the absence of including cancellation circuitry, as disclosed herein, unwanted signal components (e.g., power line interference) can be larger than the physiological signals of interest, such that increasing the gain of the amplifier sufficiently to measure biosignals from the subject can result in saturation of the amplifier. Thus, the approach described herein can be implemented with a higher sensitivity compared to many existing non-contact sensing methods without causing the system to saturate.

Figure 2:
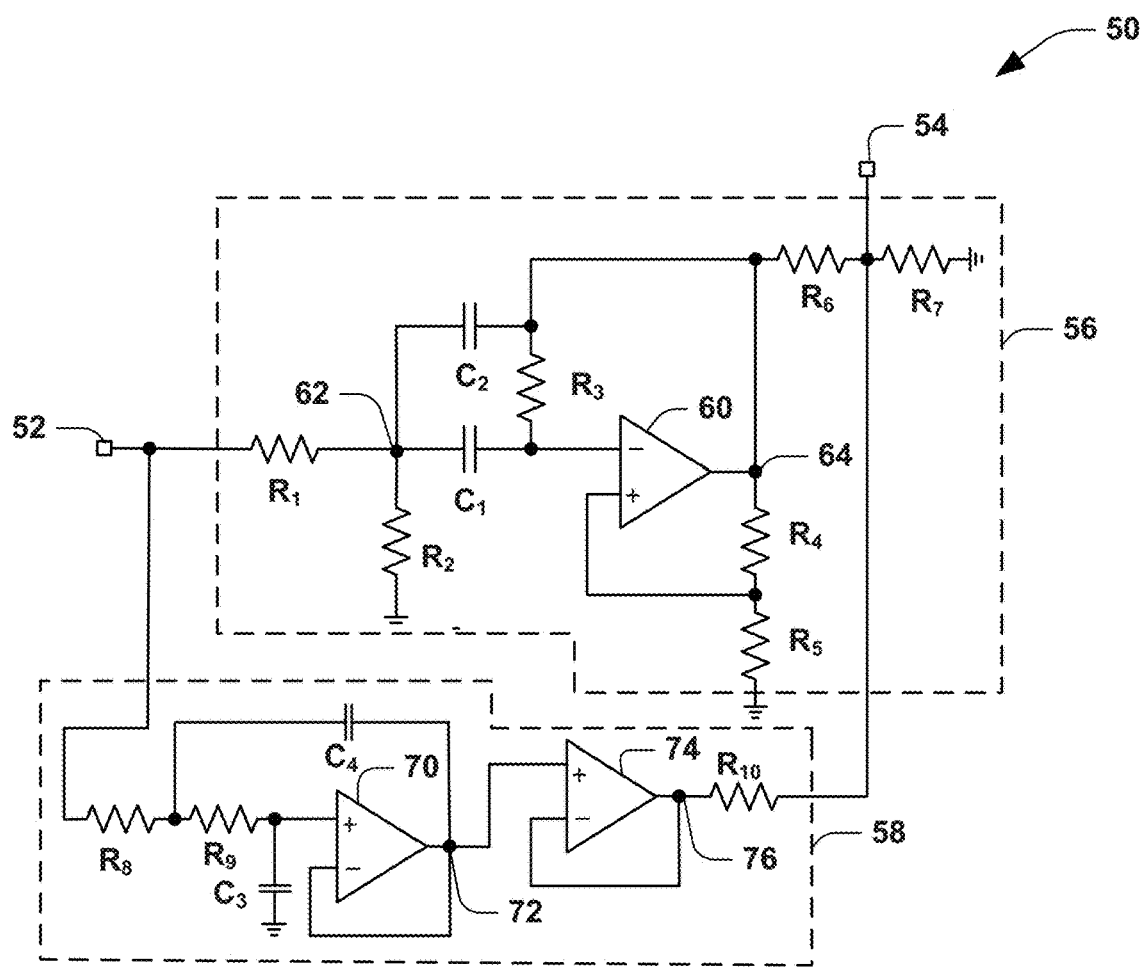
FIG. 2 depicts an example of a compensation signal generator circuit of the system of FIG. 1.

FIG. 2 depicts an example of a compensation signal generator circuit 50, such as can be implemented as the circuit 24 in the system 10 of FIG. 1. Accordingly, the description of the circuit 50 also refers to FIG. 1. The circuit 50 has an input 52 and an output 54. The input 52 can be coupled to the amplifier output 20, and the output 54 of the circuit 50 can be coupled to the amplifier input 22. In the example of FIG. 2, the circuit 50 is shown as multi-stage compensation circuit including respective compensation stages 56 and 58. The compensation stage 56 is configured to remove or cancel power line interference from the sensor signal. The compensation stage 58 is configured to remove or cancel signal components from the sensor signal due to spatial motion (e.g., of the subject). Different types of compensation stages can be used in other examples, which can depend on the types of signals being sensed and the sensing environment. Also, there can be more or fewer than two such compensation stages in such examples.

In an example, the PLI compensation stage 56 is implemented as a bandpass filter (BPF) coupled between the amplifier output 20 and non-inverting input 22. In this way, the bandpass filter is configured to create an inverse function (e.g., a notch filter) in its closed loop response. By way of example, denoting the BPF transfer function (which should be inverting to improve stability) as $-H_{BPF}(s)$, the closed-loop transfer function of the amplifier 18 at the low frequencies of interest (where the op-amp is nearly ideal) can be expressed as follows:

$$H(s) = \frac{V_{out}}{V_{in}} = \frac{-H_0(s)}{H_{BPF}(s)[1 + H_0(s)] + 1}$$

where $$H_0 = \frac{sC_C R_F}{sC_F R_F + 1}$$

is the closed-loop transfer function in the absence of the BPF and $C_c$ is the effective coupling capacitance between the body and the sensor.

This has the form of a high-pass filter with cut-in frequency of $\omega_1 = 1/(R_F C_F)$ and high frequency gain of $C_c = C_F$. Note that since $|H_0(s)|$ increases with frequency, so does sensitivity. Intuitively, this is because the impedance of the coupling capacitor $C_c$ decreases with frequency as $1/(j\omega C_c)$, resulting in increased current flow. In practice $C_c \ll C_F$ (e.g., the sensor is weakly coupled to the body), so $|H_0(s)| \ll 1$. In this case, H(s) simplifies to the following:

$$H(s) = \frac{V_{out}}{V_{in}} \approx \frac{-H_0(s)}{H_{BPF}(s) + 1}$$

In view of the above, the closed-loop voltage gain at the resonant frequency of the feedback BPF is reduced by the factor $(1+A_{BPF})$, where $A_{BPF}$ is the peak voltage gain of the BPF. Thus, PLI can be cancelled by tuning the resonant frequency of the BPF to $f_0$. In practice, the BPF should have relatively high quality factor Q (i.e., narrow bandwidth) to ensure that the closed-loop gain is only reduced around $f_0$, thus minimizing distortion of the received ECG signal. In an example, the circuit 56 can be implemented using a single op-amp design with $A_{BPF} \approx 2$ and $Q \approx 35$ to implement the feedback BPF, resulting in a cancellation amplitude and bandwidth of 3 (~10 dB) and 2 Hz, respectively.

It will be understood and appreciate that the PLI cancellation approach outlined above is but one example, and the approach can be readily extended to multiple parallel BPFs as well as to other forms of BPFs configured to cancel multiple PLI components. For example, two BPFs tuned to $f_0$ and $3f_0$ can be used to cancel both the fundamental PLI component (usually at 60 Hz) and its third harmonic (at 180 Hz). The outputs of the two BPFs are added together (e.g., using an op-amp adder circuit) before being fed back to the input terminal 22 of the amplifier 18.

In the example of FIG. 2, the PLI compensation stage 56 is implemented as a BPF that includes a resistor $R_1$ coupled to the input 52. A capacitor $C_1$ is coupled between $R_1$ and an inverting input of an amplifier (e.g., an op-amp) 60. Another resistor $R_2$ is coupled between the juncture (node) 62 between $R_1$ and $C_1$ and ground. The values of $R_1$ and $R_2$ can be adjusted to ensure that the feedback loop remains stable. A capacitor $C_2$ is coupled in series with resistor $R_3$ between node 62 and the inverting input of amplifier 60. The amplifier 60 has an output 64. A divider of resistors $R_4$ and $R_5$ is coupled between the amplifier output 64 and ground. An intermediate node 66 of the divider (between $R_4$ and $R_5$) is coupled to a non-inverting input of the amplifier 60. The value of Q can be set by configuring $R_4$ and $R_5$. The amplifier output 64 is coupled to the output 54 through a resistor $R_6$, which is coupled to ground through another resistor $R_7$. The node between $R_6$ and $R_7$ thus defines the output 54 in this example. The amplifier output 64 is also coupled to the node between $C_2$ and $R_3$.

The motion compensation stage 58 can be implemented in the analog domain as including a low pass filter (LPF). In the example of FIG. 2, the analog motion compensation stage 58 is shown as a second order LPF, but other configurations of LPFs could be implemented in other examples. The example motion compensation stage 58 includes an amplifier 70 having a non-inverting input coupled to the input 52 through resistors $R_8$ and $R_9$. A capacitor $C_3$ is coupled between the non-inverting input and ground. An inverting input of the amplifier 70 is coupled to an output 72 of the amplifier. A capacitor $C_4$ is coupled between the output 72 and a node between $R_8$ and $R_9$. The output 72 is coupled to the output 54 through a buffer amplifier and a resistor $R_{10}$. Thus, in the example of FIG. 2, the compensation stage 58 is implemented as a low pass filter configured to remove signal components corresponding to motion of the subject being monitored, such as tuned to pass signals less than about 0.5 Hz. The signals from the motion compensation stage 58 can be combined with the signals from the PLI compensation stage 56, which aggregate signal can be removed from the sensed signal received at the input 16 of the amplifier 18, as described herein.

Figure 3:
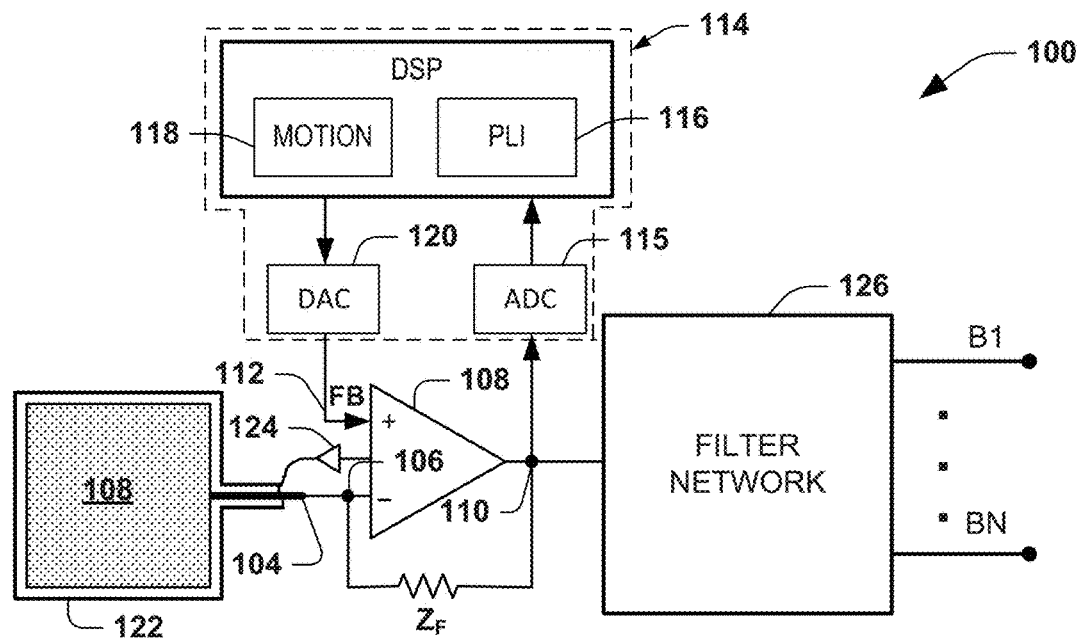
FIG. 3 depicts an example of another non-contact sensing system.

FIG. 3 depicts an example of another non-contact sensing system 100. The system 100 includes a non-contact sensing electrode 102 configured sense an electric potential and provide a sensor signal at an output 104 of the sensing electrode based on the sensed electric potential. For example, the non-contact sensing electrode 102 is adapted to measure electric potential from the body of a human subject. The sensor output 104 is coupled to an input 106 of an amplifier 108. The amplifier 108 can be a trans-impedance amplifier, such as described herein. The amplifier 108 thus is configured to provide an amplified output signal at an output 110 thereof representative of one or more biosignals (measured from a subject) based on the sensor signal (from the sensing electrode 102) and a feedback signal FB provided to a second input 112 of the amplifier (by compensation signal generator 114). A feedback impedance $Z_F$ is coupled between the output 110 and the input 106, which can be configured to provide the amplifier a high gain resulting in high sensitivity as described herein.

The system 100 includes a compensation signal generator circuit 114 coupled between the output 110 and second (e.g., non-inverting) input 112 of the amplifier 108. In the example of FIG. 3, the compensation signal generator circuit 114 is shown as implemented using digital circuitry configured to provide active (real-time) feedback. For example, the compensation signal generator circuit 114 includes a microcontroller or digital signal processor (DSP) that executes machine-readable instructions configured to remove unwanted noise from the system. Other forms of digital circuitry can be used in other examples, such as discrete logic, a microcontroller or the like. As described herein, the noise may include electrical environmental noise (e.g., power line interference) and/or spatial environmental noise (e.g., due to motion or movement of the subject being sensed).

For example, the compensation signal generator circuit 114 includes and analog-to-digital converter (ADC) 115 coupled between the amplifier output 110 and an input of the DSP. The DSP is shown as including a power line interference (PLI) estimation function 116 configured to estimate a signal spectrum representing the PLI, e.g., at about 60 Hz and its harmonics. Additionally or alternatively, the DSP includes a motion noise estimator 118 configured to estimate artifacts due spatial motion of a subject and feed the estimated noise to the second terminal of the amplifier. The estimated motion noise can vary based on the distance between the sensing electrode and the subject. The DSP can combine each of the estimated noise components (e.g., summed together) and provide the aggregate noise to a digital-to-analog converter (DAC) 120, which is configured to convert the digital aggregate noise estimate to a corresponding analog version representative of one or more spectra of noise (e.g., line noise and motion noise) to be cancelled. The DAC 120 has an output coupled to the non-inverting input 112 of the amplifier, and is configured to feed the analog noise estimate (FB) back to the input 112. The analog noise estimate signal FB that is fed back effectively cancels the unwanted signal components, thus allowing amplifier feedback impedance $Z_F$ between 110 and 106 to be increased to provide an increased gain without saturating the output of the amplifier 108. For example, the feedback impedance can be implemented as an RC network or simply as a resistance, such as described herein. Because the overall sensitivity of the sensor is directly proportional to $Z_F$, the net result of such noise cancellation approach is greatly improved sensitivity compared to the state of the art.

In some examples, the system 100 also may include a guard electrode 122 having an input coupled to the amplifier. A guard amplifier (e.g., a unity gain buffer) 124 is configured to drive the guard electrode 122 with a voltage, such as a replica of a common mode voltage of the amplifier 108 that may vary responsive to sensor signal at 104. This results in the guard electrode 122 maintaining the same common mode voltage as the sensing electrode 102, which results in a net zero voltage difference between the respective electrodes. The use of such guard electrode 122 can further lead to reduced leakage current and higher impedance from the perspective of the first input 106 of the amplifier 108. The guard electrode 122 also improves common mode rejection ratio of the amplifier 108 during sensing operation.

In an example, the sensing electrode, amplifier and feedback system reside on a common substrate and define a respective sensing node. There can be any number of sensing nodes in the system, which may vary according to application requirements. For example, the substrate may be implemented as a printed circuit board in which the sensing electrode lies in a plane that is parallel with a surface of the printed circuit board. Additionally, the guard electrode 122 includes a first planar portion (not shown but see FIG. 6) that is spaced from and parallel to a planar surface of the sensing electrode 102. In an example, the first planar portion of the guard electrode 122 is coupled to a second portion of the guard electrode 122 through vias. The second portion of the guard electrode 122 thus may reside in the same plane as and at least partially surrounds the sensing electrode 102.

The system 100 also includes a filter system 126 having an input coupled to the output 110 of the amplifier 108. The filter system 126 includes a multistage arrangement of filters, such as including notch filters and biosignal filter paths, configured to provide respective output biosignals demonstrated at Bi through $B_N$, where N is a positive integer denoting the number of different biosignals. Thus, by configuring the system 100 to include an arrangement of passive and active noise cancellation stages, as described herein (e.g., guard electrode 122, compensation signal generator 114, filter system 126), further enhanced sensitivity can be achieved.

Figure 4:
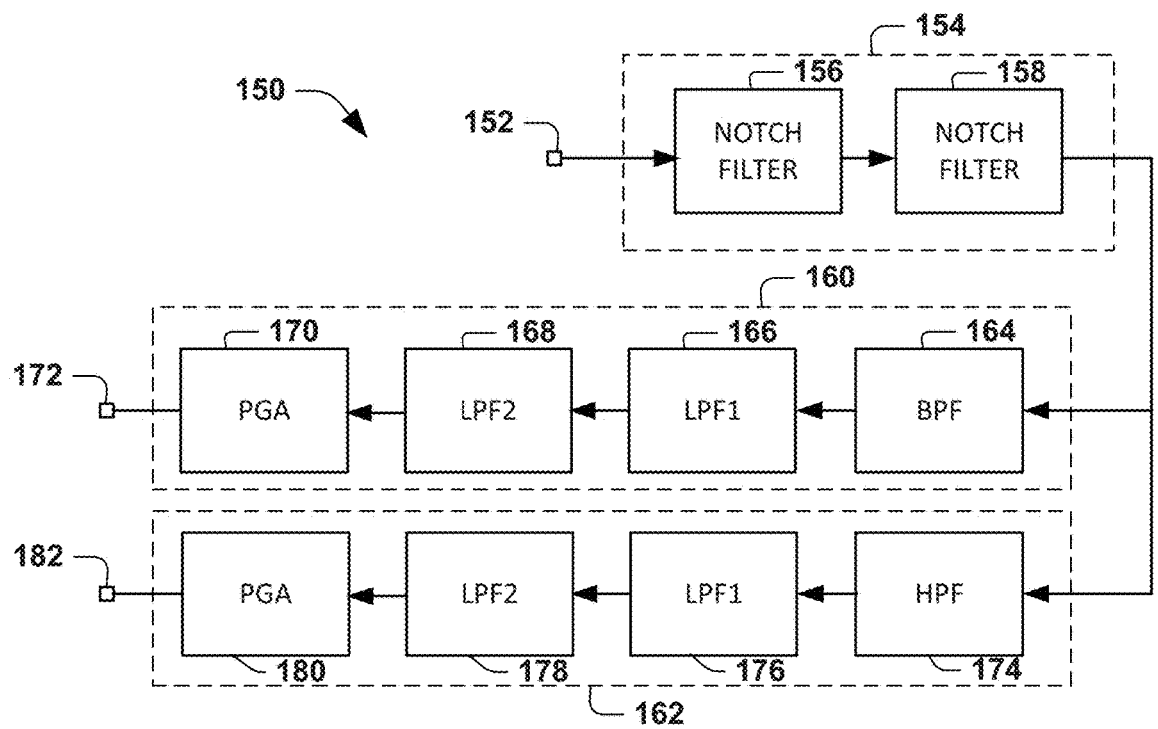
FIG. 4 depicts an example of a filter network of the system of FIG. 1.

FIG. 4 depicts an example of a filter network 150. The filter network can be used to implement the filter network 30 of FIG. 1 or 126 of FIG. 3. Accordingly, reference can be made back to FIGS. 1 and 3 in relation to the description of FIG. 4. In the example of FIG. 4, the filter network 150 is configured to provide multiple biosignals at respective outputs 172 and 182 representing an electrocardiogram (ECG) and respiration cycle (RC) of a subject, based on an amplified sensor signal provided at an input 152 (e.g., at output 20 or 110). For example, the amplified sensor signal at 152 corresponds to an amplified version of an electric potential measured by a sensing electrode (e.g., electrode 12, 102). The filter system 126 can be implemented using analog circuits or, in other examples, such filters can be implemented as part of data acquisition circuitry (e.g., a microcontroller or field programmable gate array (FPGA)) configured to perform digital signal processing on digitized versions of the signals.

The filter system 150 includes a notch filter network 154 configured to attenuate unwanted frequencies. For example, the notch filter network 154 includes multiple notch filters 156 and 158 configured to remove frequencies corresponding to expected line noise (e.g., 60 Hz and 120 Hz notch filters). The output of notch filter network 154 is coupled to an input of one or more multistage filter paths 160, 162. For example, the multi-stage filter path 160 is configured to extract an electrocardiogram (ECG) signal from the input biosignal received at 152, and the filter path 162 is configured to extract a respiration cycle (RC) signal from the input biosignal. Respective heart rate and respiration rate can be readily derived from the ECG and RC signals, respectively. While two filter paths 160, 162 are demonstrated in the example of FIG. 4, other numbers and types of filter paths may be implemented in other examples according to the type and number of biosignals being sensed.

By way of example, the ECG filter path 160 includes a band pass filter stage 164 having an input coupled to the output of the notch filter circuit 154. A low pass filter stage (e.g., a second order LP filter) 166 has an input coupled to an output of the bandpass filter stage and another low pass filter stage 168 performs additional low pass filtering on the signal. The LP filters 166 and 168 define the final bandwidth of the ECG channel (e.g., set to 154 Hz). A programmable gain amplifier (PGA) 170 has an input coupled to an output of the low pass filter stage 168 and is configured to provide an output signal at an output 172 representative of the measured ECG signal for the subject.

By way of further example, the multi-stage filter path 162 includes an arrangement of filters to extract respiration cycle (RC) signal. The multi-stage filter path 162 includes a high pass filter (HPF) stage 174 having an input coupled to the output of the notch filter 154. A series of low pass (LP) filter stages 176 and 178 are configured to perform low pass filtering of the high-pass filtered signal. The LP filter stages define the final bandwidth of the RC channel (e.g., to about 2.6 Hz). A programmable gain amplifier (PGA) 180 has an input coupled to an output of the low pass filter stage 178. The PGA 180 is configured to provide an output signal at an output 182 representative of the measured RC of the subject.

Each of the biosignals at outputs 172 and 182 may be coupled to an interface (e.g., wired or wireless interface) configured to communicate the respective signals to a local base station. The base station may receive signals from any number of sensors nodes and send such signals to a cloud server (or other back end computing system) for additional processing. The signals may be communicated in real time or be recorded (stored in memory) and sent in batches. Such additional processing may include deep learning algorithms used for statistical verification, data fusion, and high-level feature extraction.

Figure 5:
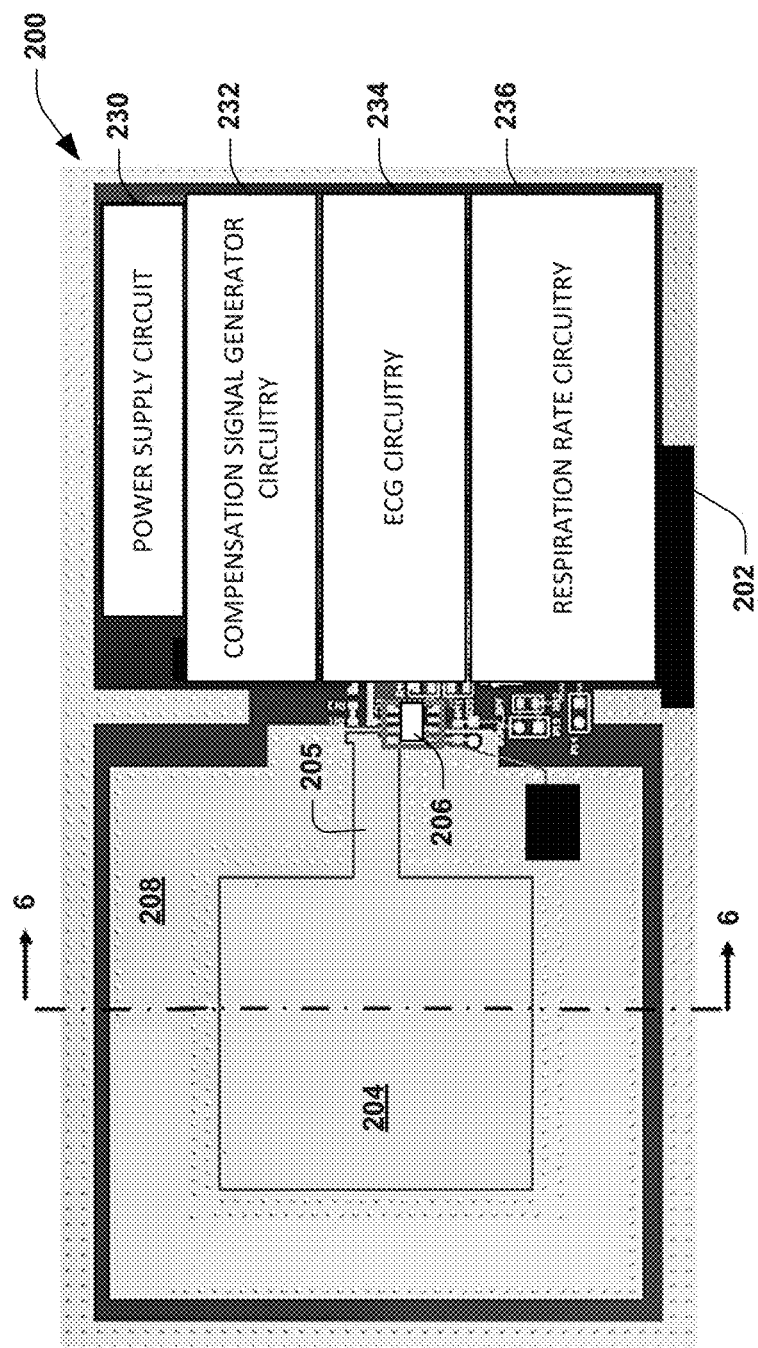
FIG. 5 depicts an example of a sensing node implemented on a substrate.
Figure 6:
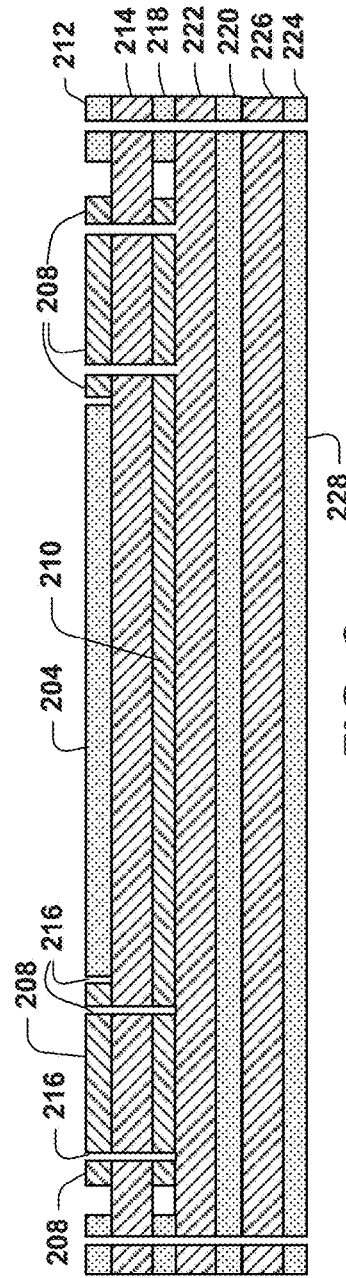
FIG. 6 depicts a cross-sectional view of the non-contact sensor and substrate taken along line 6-6 in FIG. 5.

FIGS. 5 and 6 depict an example of sensor node 200, which includes a non-contact sensing system implemented on a printed circuit board 202. The arrangement of components on the sensor node 200 may be used to implement the non-contact sensing system 10 and 100 shown with respect to FIGS. 1, 2, 3 and 4. Accordingly, additional information about parts of the sensor node 200 may be obtained by referring back to FIGS. 1-4.

The sensor node 200 includes a sensing electrode 204 formed of a plate of an electrically conductive material (e.g., copper, aluminum or other conductive material) on a surface of the printed circuit board 202. The sensing electrode 204 includes a body portion that is rectangular (e.g., square) in shape. Other shapes could be used in other examples. A trace 205 extends from the body portion to an input (e.g., the inverting input) of an amplifier (e.g., a trans-impedance amplifier or TIA) 206. The sensing electrode 204 is separated from a surface portion of a guard electrode 208 (e.g., on a top layer of the PCB 202). The surface portion of the guard electrode 208 and the sensing electrode can be coplanar (on the surface of the PCB). The surface portion of the guard electrode 208 is configured and arranged to surround the sensing electrode 204. For example, an inner periphery of the surface portion of the guard electrode 208 is spaced apart from an outer periphery of the sensing electrode 204 by an isolation trench, which may be cut or etched into the surface of the trace material (e.g., to electrically isolate the electrode structures on the top layer of the PCB 202).

As shown in the cross-sectional view of FIG. 4, the sensing electrode and top portion guard electrode reside on a top layer 212 of the PCB 202. The guard electrode also includes another portion 210 beneath the surface portion guard electrode 208 and the sensing electrode 204. The lower guard electrode portion 210 is separated from the top layer structures (e.g., sensing electrode 204 and surface portion guard electrode 208) by a dielectric layer 214. That is, the guard electrode portion 210 can be embedded within the PCB and is coupled to the surface portion guard electrode 208 through vias 216. The example PCB 202 also includes first and second signal layers 218 and 220 spaced apart from each other by another dielectric layer 222. A bottom layer 224 (on the opposite surface from the top layer 212) is spaced from signal layer 220 by another dielectric layer 226. The bottom layer 224 can also include a ground shield 228, such as to help shield (e.g., cancel) electrostatic and/or other interference from the electric potentials being measured by sensing electrode 204.

Also shown on the sensor node 200 are circuitry used to operate the sensor node. The circuitry includes a power supply circuit 230, compensation signal generator circuitry 232 and biosignal extraction circuitry 234 and 236. The compensation signal generator circuitry 232 is coupled to the amplifier 206 (e.g., coupled between the amplifier output and non-inverting input). In the example of FIG. 5, the biosignal extraction circuitry includes ECG circuitry 234 and RC circuitry 236 configured to extract respective ECG and RC signals from the sensed, amplified and filtered biosignal. As described herein, the circuitry 232, 234 and 236 can be implemented as analog and/or digital circuitry.

FIG. 7 depicts an example of a multi-sensor system 300. The system 300 includes a plurality of non-contact sensing electrodes 302, shown as $S_1$ through $S_N$, where N is a positive integer denoting the number of sensing electrodes. Each of the electrodes can be implemented according to any of the examples disclosed herein (see, e.g., FIGS. 1, 3, 5 and 6). One or more passive noise cancellation features can also be operatively associated with each of the sensing electrodes 302, such as to reduce PLI, leakage and/or other noise with respect to the sensing electrode. For example, a guard electrode 304 and/or shielding (not shown in FIG. 7) can be disposed along a perimeter of the sensing electrode 302, such as disclosed herein. The guard electrode 304 can be driven with a guard voltage (e.g., a common mode or other voltage associated with the respective sensor, such as by the built-in guard driver of the ADA-4530-1), as disclosed herein.

Additionally, as disclosed herein, an output of each sensing electrode 302 is coupled to an input (e.g., inverting input) of a respective amplifier 306 to provide an input signal representative of sensed electric potential. As described herein, the sensed electric potential can include (e.g., encode) one or more biosignals representative of respective physiological conditions of the subject, such as ECG, EEG, EMG, RC, subject position/movement and the like. Each amplifier 306 is configured to provide an amplified sensor signal at a respective output 308 thereof. The outputs 308 can be coupled to inputs of a microcontroller 310, such as to provide multi-channel physiological measurements to the microcontroller. Another input (e.g., a non-inverting input) 312 of the amplifier 306 is adapted to receive a compensation signal, shown as COMP SIGNAL_1 through COMP SIGNAL_N, such as can be generated by compensation signal generator circuitry, such as disclosed herein. For example, compensation signal generator circuitry (e.g., circuitry 24, 50, 114, 232) can be coupled between the output 308 and input 312 of each amplifier 306. Such compensation signal generator circuitry can be configured to provide estimates of noise and/or interference to the non-inverting amplifier inputs 312. In an example, the microcontroller 310 can be coupled between respective amplifier outputs 308 and inputs 312 and include circuit functions configured to generate the noise/interference estimates, as described herein. The multi-sensor outputs can provide spatially resolved physiological measurements for the subject depending on the spatial arrangement of the sensing electrodes 302. Additionally, feedback impedance $Z_F$ is coupled between the amplifier outputs and inverting inputs of the respective amplifiers. As described herein, $Z_F$ can be implemented as having a large impedance value (e.g., resistance and/or capacitance) to provide each amplifier 306 a desired gain value to increase sensitivity. In an example, the microcontroller 310 is further configured to perform filtering and signal extraction with respect to the amplified signals provided by each amplifier 306, such as corresponding to the functions of filter networks 30, 126, 234, 236. In some examples, one or more other active and/or passive sensors (e.g., thermal sensors, video cameras, lasers, etc.) can be used in connection with the electric potential sensors 302, and the microcontroller 310 can combine information based on the aggregate set of measurements to provide additional information describing physiological or other conditions of the subject or the environment.

FIGS. 8 and 9 depict another example of a multi-sensor system 350 that includes a plurality of non-contact sensing electrodes 352. Each of the sensing electrodes 352 can be implemented according to any of the examples disclosed herein (e.g., electrodes 12, 102, 204, 302). Additional passive noise cancellation features (e.g., guard electrodes and/or shielding) can be operatively associated with each of the sensing electrodes 352, such as described herein. In the example of FIGS. 8 and 9, the sensing electrodes 352 are configured and arranged on a surface 354 of a substrate 356 (e.g., a top surface of a PCB) as an array (e.g., a 4×4 array) of electrodes distributed across the surface 354. Other numbers and arrangements of sensing electrodes can be used in other examples. By implementing an array of the sensing electrodes 352, the system 350 can provide spatially resolved measurements of one or more physiological conditions.

The system 350 also includes circuitry on another side 358 of the substrate 356. In the high-level example of FIG. 9, the circuitry includes an analog front end system 360 and a microcontroller 362. For example, the analog front end system 360 can include a multi-channel circuit coupled to each of the sensing electrodes 352 and configured (e.g., including trans-impedance amplifier and feedback circuitry) to amplify and filter the sensed physiological signals. Compensation signal generator circuitry, as disclosed herein, can be implemented by the analog front end system 360 and/or the microcontroller 362 to perform filtering and active feedback techniques to cancel unwanted signal components (e.g., PLI and motion artifacts) for each of the respective signal channels. The microcontroller 362 can be configured to perform additional filter functions and extract one or more physiological signals of interest.

In an example, the microcontroller 362 includes a communications interface 366 coupled to an antenna 364. For example, the communications interface 366 is configured to communicate using a wireless data communications protocol (e.g., Bluetooth, Wi-Fi, cellular data, near-field communications, or the like), such as to send and/or receive data. In other examples a physical medium and associated protocol can be used for communications (e.g., electrical wire or optical fiber). In an example, the microcontroller 362 is configured to communicate biosignal data to a remote device (e.g., a computer or back office system) through the antenna 364. The biosignal data can be representative of electric potentials sensed by the sensing electrodes 352 and/or of information derived from the sensed potentials (e.g., through computations executed by the microcontroller 362). The communications interface 366 can also receive instructions or other data, such as operating parameters to program or configure the sensing system 350 (e.g., to configure programmable resistors, capacitors or other parameters). The microcontroller 362 thus can configure and/or control one or more operating parameters of the analog front end system 360 based on instructions and/or control data received from a remote device (e.g., a computer, cell phone, etc.).

Figure 10:
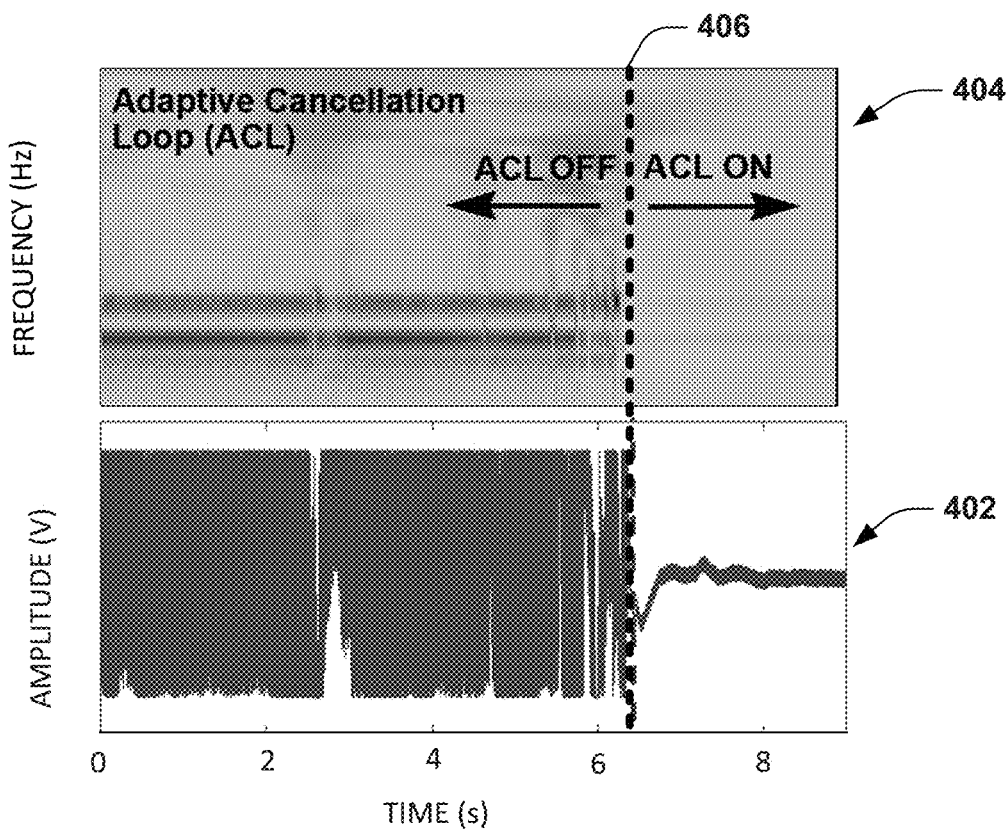
FIG. 10 depicts amplitude and frequency plots showing performance of power line interference cancellation from use of a compensation signal generator circuit in the sensing system.
Figure 11:
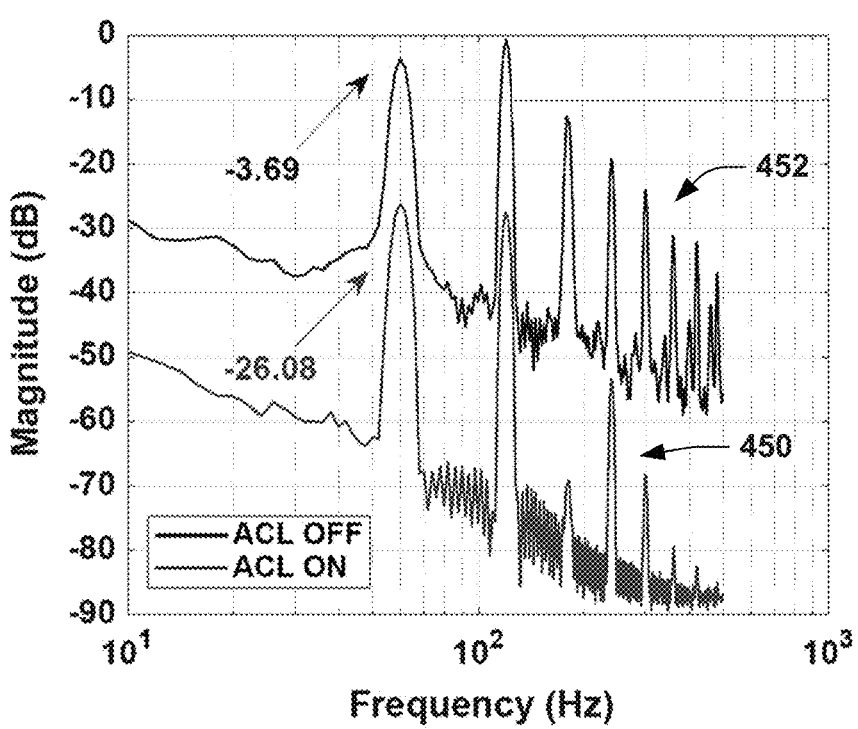
FIG. 11 depicts an example signal spectra showing performance of power line interference cancellation by a compensation signal generator circuit of the sensing system.

FIGS. 10, 11, 12 and 13 illustrate examples of enhanced performance that can be provided using adaptive cancellation implemented by a compensation signal generator circuit (e.g., 24, 50, 114, 232) of a sensing system as disclosed herein. For the examples of FIGS. 10-13, the data was generated using a sensor node implemented on a PCB with electrostatic shields on the top and bottom surfaces to mitigate PLI at 60 Hz and 120 Hz. The addition of such shields, in combination with a guard loop (e.g., guard loop 122, 208, 304) on the surface of the main sensing electrode, reduced PLI significantly, such as shown in FIGS. 10 and 11.

FIG. 10 depicts amplitude and frequency plots 402 and 404 showing performance of power line interference cancellation from use of a compensation signal generator circuit (e.g., circuit 56 or 116) in the sensing system. For example, FIG. 10 shows frequency and amplitude of a sensed signal over time with and without active cancellation (designated on opposite sides of line 406).

FIG. 11 depicts an example signal spectra showing performance of power line interference cancellation when the adaptive PLI cancellation is used, shown at 450, and when the PLI cancellation is turned off, shown at 452. FIG. 11 demonstrates that the PLI loop provides greater than about 20 dB of suppression by itself.

Figure 12:
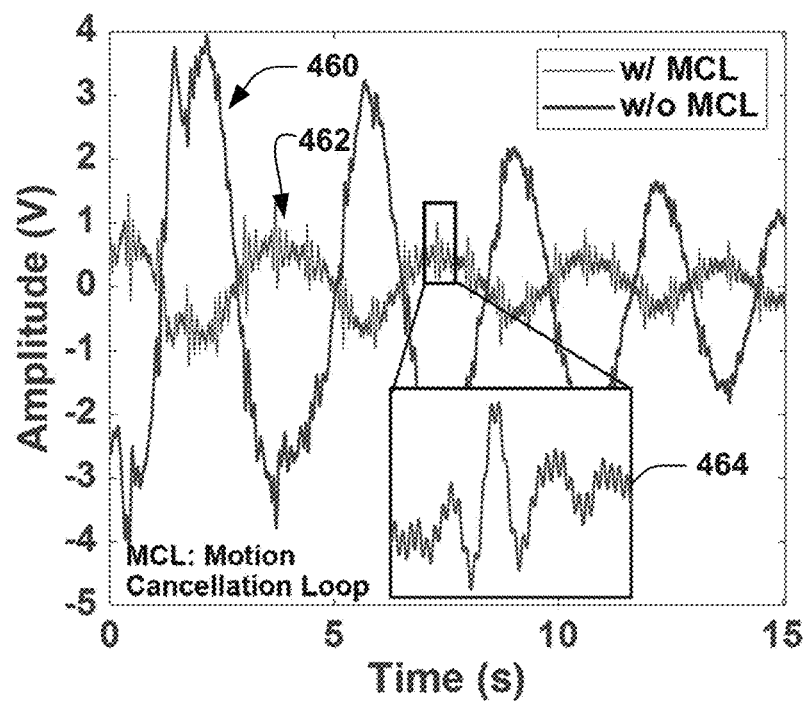
FIG. 12 depicts amplitude plots showing performance of motion cancellation implemented by a compensation signal generator circuit of the sensing system.

FIG. 12 depicts time domain plots 460 and 462 showing performance of motion cancellation implemented by motion circuitry (e.g., 58, 118) of a compensation signal generator circuit as disclosed herein. The plot 460 shows amplitude over time when no motion cancellation is implemented, and plot 462 shows amplitude when motion cancellation is implemented. An enlarged view of part of the motion compensated signal 462 is shown at 464.

Figure 13:
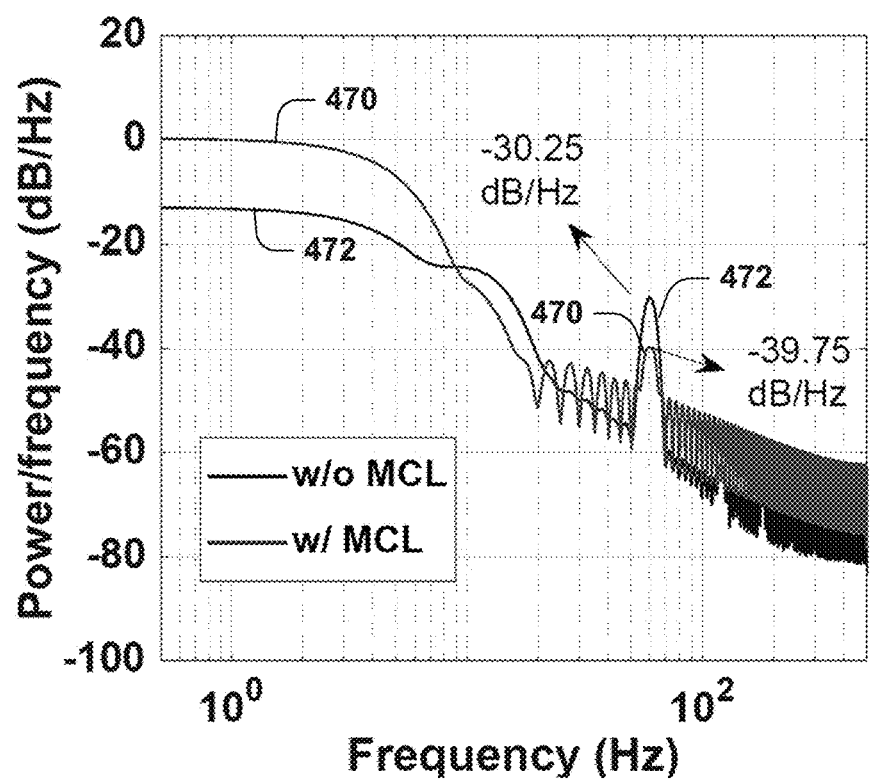
FIG. 13 depicts an example signal spectra showing performance of motion cancellation by a compensation signal generator circuit of the sensing system.

FIG. 13 depicts plots 470 and 472 of power/frequency as a function of frequency showing signal spectra performance of motion cancellation that can be implemented by a compensation signal generator circuit of the sensing system. The plot 470 shows the signal spectra when motion cancellation is used, and the plot 472 shows the signal spectra when motion cancellation is turned off. A larger than 9 dB suppression of motion artifacts is shown in the example of FIG. 13.

FIGS. 10-13 thus show results that can be readily achieved using the adaptive cancellation approach based on real-time estimation of unwanted signals (e.g., implemented by compensation signal generator circuitry disclosed herein). The design improvements in the sensor node allow the feedback impedance $Z_F$ to be significantly increased (e.g., to greater than 100 GΩ) without saturation due to PLI, thus improving overall sensitivity. Similarly, FIGS. 12 and 13 show that the feedback system (e.g., implemented using a DSP) can effectively estimate slowly-varying motion artifacts from received data and then cancel such artifacts in real-time. Additional, more sophisticated signal processing techniques may be implemented for further feature rendering and characteristic categorization of non-contact ECG measurements.

Figure 14:
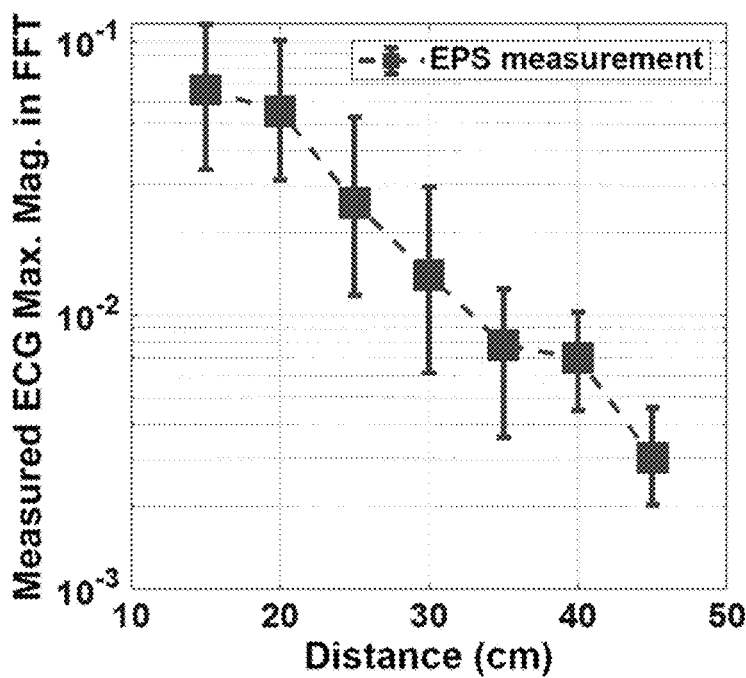
FIG. 14 depicts examples of amplitudes of measured ECG signals at different sensor distances.

FIG. 14 depicts examples of amplitudes of ECG signals measured (e.g., by a non-contact sensing electrode) at different sensor distances. In the example of FIG. 14, the power spectra used to create the plot were obtained using a fast Fourier transform (FFT). To quantify a maximum remote measurement distance, ECG signals were measured remotely at different sensor-subject distances. For example, the subject was located at distances of 15 cm to 50 cm (with a step of 5 cm) from the surface of the electrode. FIG. 14 shows that the measured ECG signal amplitude decays as the distance increases.

As an example, the measured ECG signal decay rate approximately follows $s=k/d^3$, where d is the distance between subject and electrode and k is a constant. In addition to the electrical activity of the heart muscles (which is the origin of the ECG signal), the electrical potential sensor also detects mechanical motion of the body surface induced by the heartbeat; these signals are known as the ballistocardiogram (BCG) and seismocardiogram (SCG). Thus, the detected signals shown in FIG. 14 may be considered as a combination of ECG, BCG, and SCG components. For brevity, they are referred to collectively as "ECG" herein (unless specified otherwise).

Figure 15:
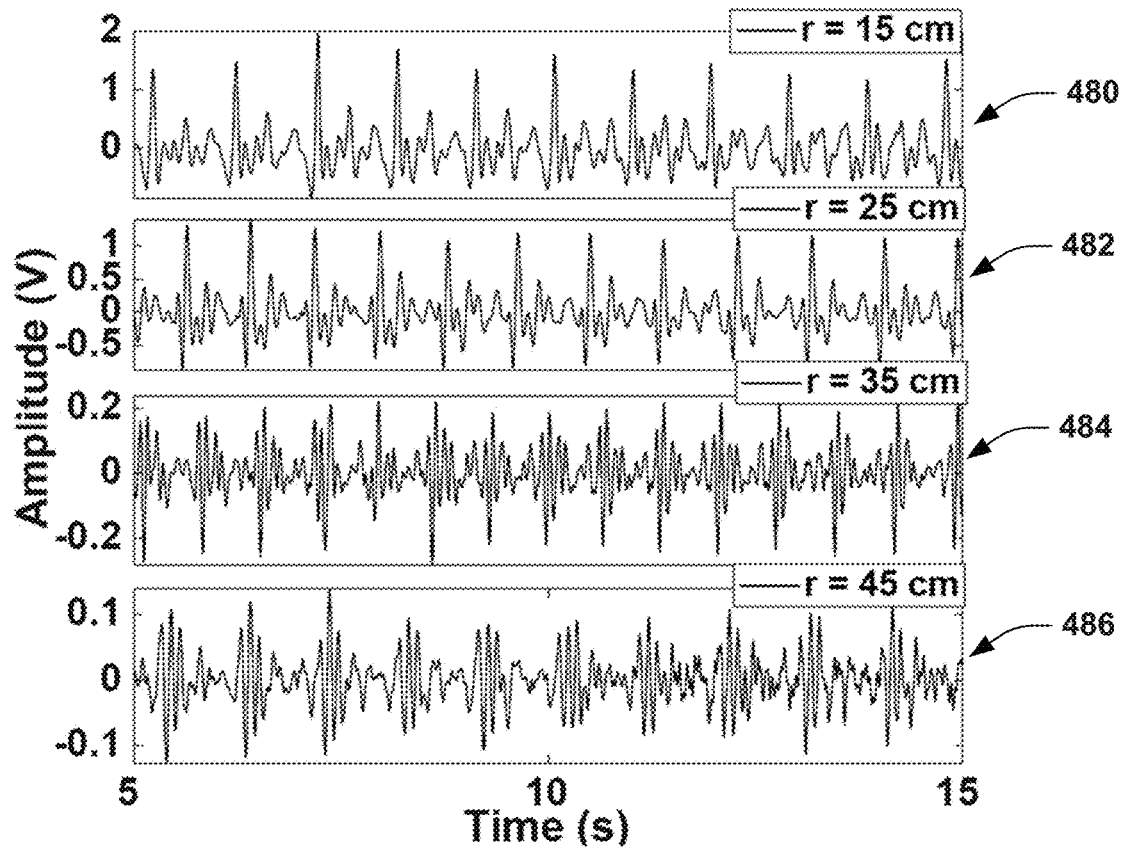
FIG. 15 depicts measured ECG signals at different sensor distances.

FIG. 15 depicts examples of measured ECG waveforms 480, 482, 484 and 486 at different sensor distances (e.g., 15 cm, 25 cm, 35 cm and 45 cm). For example, in order to visualize the time-domain waveforms, after applying adaptive cancellation, the extracted ECG time domain data can be further filtered using a continuous wavelet transform (CWT) such as the Morlet wavelet. As shown in FIG. 15, the ECG can be clearly observed at each distance. The shape of the ECG waveform changes with distance, with the QRS complex attenuating faster than some of the smaller features. This behavior is to be expected, since the shapes of the ECG, BCG, and SCG components are different and they decay at different rates that depend on a sensor-subject distance d.

Figure 16:
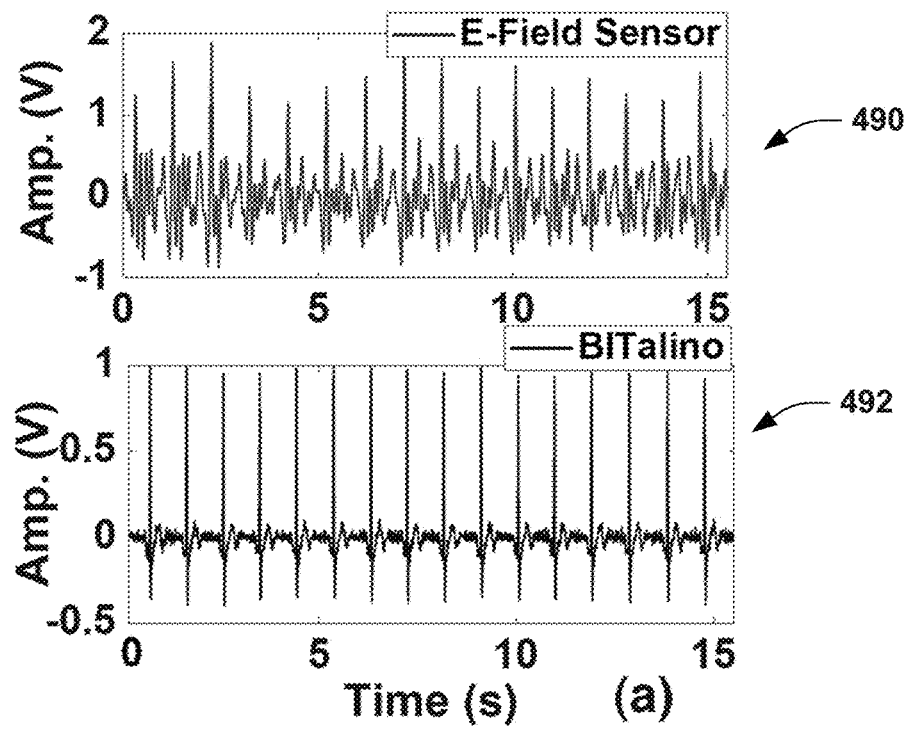
FIG. 16 are plots comparing ECG signal measured by the non-contact sensor and a reference contact sensor.

FIG. 16 depicts plots 490 and 492 comparing ECG signal measured by the non-contact sensor disclosed herein and a reference contact sensor, respectively. In this example, the two waveforms 490 and 492 are synchronized (e.g., using a body motion event). FIG. 16 thus shows that QRS complexes from the remote non-contact sensor are i) clearly observed with good signal-to-noise ratio (SNR), and ii) are well aligned in the time domain with those from the reference contact sensor. In this example recording, the subject is located 15 cm away from the sensor. Additionally, there are no statistically significant differences between the heart rates estimated from these two synchronized recordings.

Figure 17:
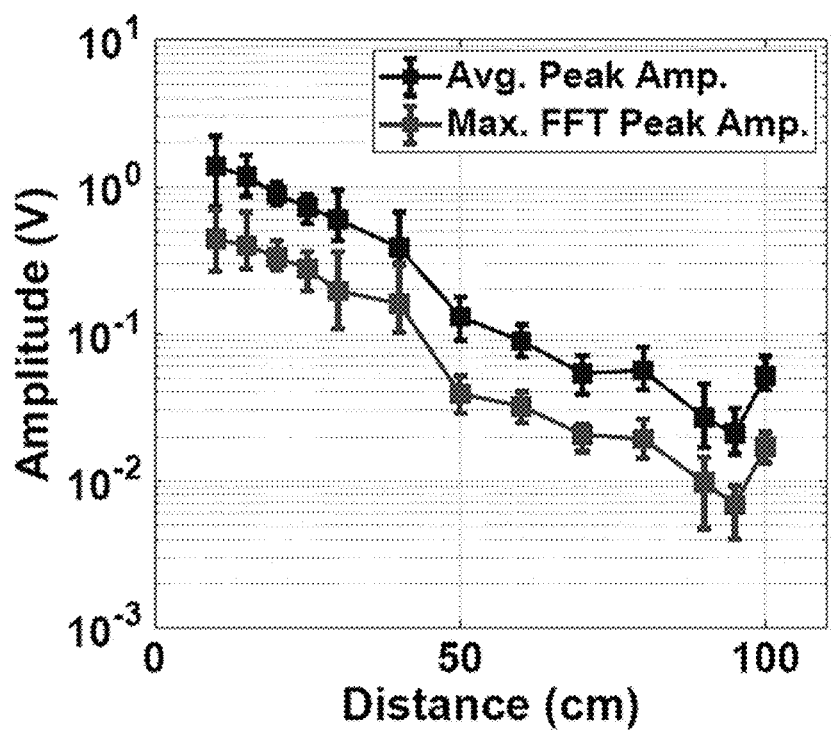
FIG. 17 depicts examples of respiration cycle amplitudes measured at different distances.
Figure 18:
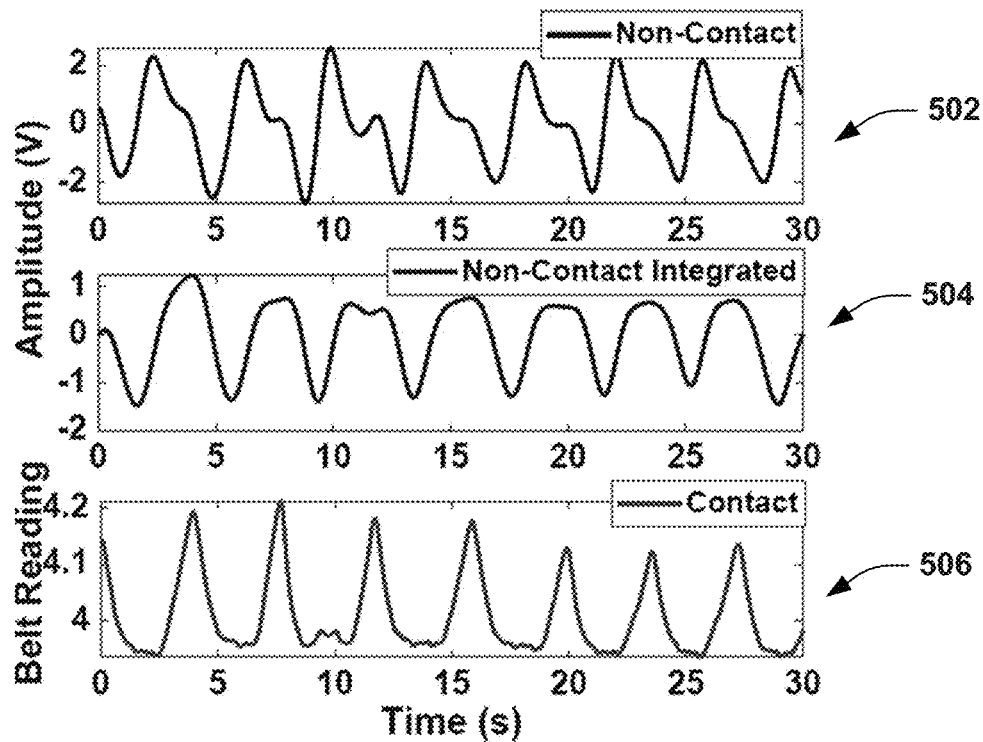
FIG. 18 depicts an example of synchronized respiration recordings using an example non-contact sensor at a first distance and a reference sensor.

As described herein, the systems and method herein further may be used to remotely measure RC signals at different sensor-subject distances. For example, FIG. 17 demonstrates signal amplitudes for RC signals where the subject was located at distances of d=10 cm to 100 cm (with a step of 10 cm) from the surface of the electrode. FIG. 18 shows that the measured RC signal amplitude decays as the distance increases; this approximately follows as $s(d)=k/d^2$. This is because RC sensing is based on detecting changes in the coupling capacitance $C_c$ due to chest wall motion. In particular, the fact that $C_c$ varies with time induces current variations ($I=dQ/dt=V\, dC_c/dt$) at the electrode assuming that human body potential V is constant during respiration monitoring; the amplitude of these variations scales as $\Delta C_c \propto 1/d^2$.

Figure 19:
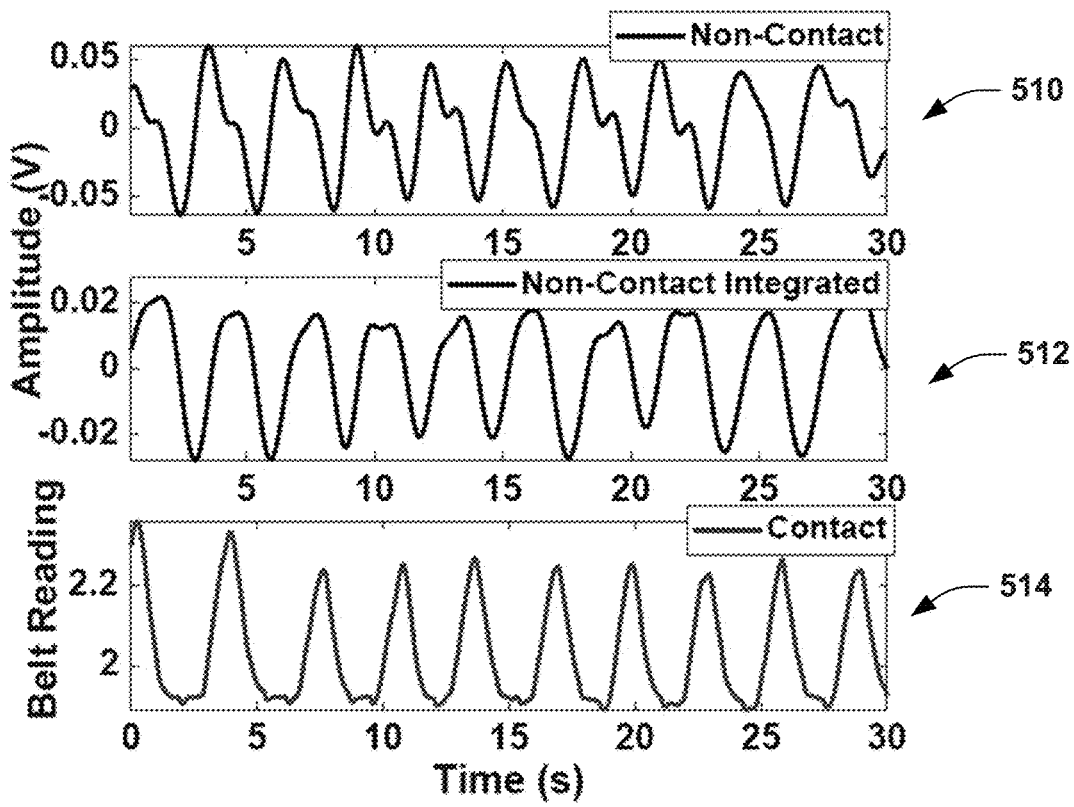
FIG. 19 depicts an example of synchronized respiration recordings using an example non-contact sensor at a second distance and a reference sensor.

FIGS. 18 and 19 depict examples of synchronized respiration recordings showing RC data using a reference sensor (e.g., a NeuLog USB recording platform using a conventional respiration monitoring belt) and an example non-contact sensor at different distances. FIG. 18 shows waveforms 502 and 504 obtained from an example non-contact sensing electrode positioned at 10 cm from the subject. Waveform 506 was obtained using the reference contact sensor. In FIG. 19, waveforms 510 and 512 were obtained from a non-contact sensing electrode, as disclosed herein, positioned at 100 cm from the subject. The "integrated" signals 504 and 512 from the non-contact sensor (obtained by integrating the raw signal along the time axis, shown on the middle row) is in phase with the recording from belt sensor.

For example, the integrated signals can be expressed as:

$$V_{int} = R_f \times V \int dC_c = R_f \times VC_c(t) =$$
$$R_f Q_c(t) = R_f V \frac{\delta_0 A}{d - d_0 \sin(2\pi ft)} \approx R_f V \left(\frac{\delta_0 A}{d}\right)\left(1 - \frac{d_0 \sin(2\pi ft)}{d}\right),$$

where V is the human body potential (assumed to be fixed), $\epsilon_0$ is permittivity of air, d is the average distance from chest to sensing electrode, A is the equivalent plate area of the coupling capacitor, $d_0$ is the amplitude of the chest motion, and f is approximately the respiration rate; note that we assume chest motion is purely sinusoidal for simplicity. Thus, the integrated voltage $V_{int}(t)$ contains an AC component that is in phase with the chest motion, and in particular is maximal when the subject's chest circumference is maximal; this point also corresponds to the maximum reading on the belt sensor (corresponding to maximum lung pressure). Excellent correlation of peak-to-peak durations and peak locations between the integrated signals and the contact belt readings is clearly demonstrated in FIGS. 18 and 19.

In this application, the term "couple" or "couples" means either an indirect or direct connection. Thus, if a first device couples to a second device, that connection may be through a direct connection or through an indirect connection via other devices and connections. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What have been described above are examples. It is, of course, not possible to describe every conceivable combination of structures, components, or methods, but one of ordinary skill in the art will recognize that many further combinations and permutations are possible. Accordingly, the invention is intended to embrace all such alterations, modifications, and variations that fall within the scope of this application, including the appended claims.

Where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to.

The term "based on" means based at least in part on. Therefore, if X is based on Y, X may be a function of Y and any number of other factors.

What is claimed is:

1. A sensing system comprising:
   a non-contact sensing electrode configured to sense an electric potential from an animal subject and provide a sensor signal at an output of the sensing electrode based on the sensed electric potential, wherein the animal subject is spaced a distance apart from and does not contact any part of the sensing electrode;
   an amplifier having a first input, a second input, and an output, in which the output of the sensing electrode is coupled to the first input of the amplifier, the amplifier is configured to provide an amplified output signal at the output of the amplifier representative of at least one measured biosignal based on the sensor signal provided to the first input of the amplifier and a feedback signal provided to the second input of the amplifier; and a compensation signal generator circuit having an input and an output, in which the input of the compensation signal generator circuit is coupled to the output of the amplifier and the output of compensation signal generator circuit is coupled to the second input of the amplifier, the compensation signal generator circuit is configured to estimate noise based on the amplified output signal at the output of the amplifier, the compensation signal generator circuit is configured to provide the feedback signal to the second input of the amplifier, and the feedback signal includes a filtered signal representative of the estimated noise to cancel the estimated noise and mitigate saturation of the amplifier, wherein the amplifier comprises a trans-impedance amplifier; and a passive impedance device coupled in a feedback path between the output of the amplifier and the first input of the amplifier, in which a gain of the trans-impedance amplifier is set based on an impedance of the passive impedance device.

2. The system of claim 1, wherein the passive impedance device comprises a resistor, which is coupled between the output of the amplifier and the first input of the amplifier, having a resistance that is greater than or equal to 100 GΩ.

3. The system of claim 1, further comprising a guard electrode adjacent the sensing electrode, wherein the guard electrode includes a first planar portion that is spaced from and parallel to the sensing electrode, the first planar portion coupled to a second portion of the guard electrode that resides in the same plane as and at least partially surrounds the sensing electrode.

4. The system of claim 1, further comprising a filter network coupled to the output of the amplifier, the filter network configured to extract the at least one measured biosignal from the amplified output signal.

5. The system of claim 4, wherein the filter network further comprises:
  a notch filter configured to attenuate frequencies corresponding to expected line noise and provide a first filtered signal; and
  at least one biosignal filter path having an input coupled to an output of the notch filter, the biosignal filter path configured to perform multiple filtering stages on the first filtered signal and provide an output signal representative of the at least one measured biosignal.

6. The system of claim 5, wherein the at least one biosignal filter path includes a plurality of respective biosignal paths, each configured to provide an output representative of at least one respective biosignal.

7. A sensing system comprising:
  a single non-contact sensing electrode configured to sense an electric potential from an animal subject and provide a sensor signal at an output of the sensing electrode based on the sensed electric potential;
  a passive electrical component;
  an amplifier having a first input, a second input, and an output, in which the output of the sensing electrode is coupled to the first input of the amplifier, the passive electrical component is coupled between the output of the amplifier and the first input of the amplifier, a gain of the amplifier is set based on an impedance of the passive electrical component, the amplifier is configured to provide an amplified output signal at the output of the amplifier based on the sensor signal received at the first input of the amplifier and a feedback signal provided to the second input of the amplifier, and the amplified output signal is representative of at least one measured biosignal of the animal subject; and a compensation signal generator circuit having an input and an output, in which the input of the compensation signal generator circuit is coupled to the output of the amplifier and the input of the compensation signal generator circuit is coupled to the second input of the amplifier, the compensation signal generator circuit is configured to estimate at least one of electrical environmental noise and spatial environmental noise based on the amplified output signal, the compensation signal generator circuit is further configured to provide the feedback signal to the second input of the amplifier, and the feedback signal includes a filtered signal representative of the estimated noise to remove the estimated noise and mitigate saturation of the amplifier.

8. The system of claim 7, wherein the amplifier comprises a trans-impedance amplifier, and the passive electrical component comprises a resistor having a resistance that is greater than or equal to 100 GΩ.

9. The system of claim 7, further comprising a guard electrode adjacent the sensing electrode, wherein the guard electrode includes a first planar portion that is spaced from and parallel to the sensing electrode, the first planar portion of the guard electrode is coupled to a second planar portion of the guard electrode that resides in the same plane as and at least partially surrounds the sensing electrode.

10. The system of claim 7, further comprising:
  a filter network coupled to the output of the amplifier, wherein the filter network further comprises:
    a notch filter configured to attenuate frequencies corresponding to expected line noise and provide a first filtered signal; and
    at least one biosignal filter path having an input coupled to an output of the notch filter, the biosignal filter path configured to perform at least one filtering stage on the first filtered signal and provide an output signal representative of the at least one measured biosignal.

11. The system of claim 7, wherein the sensing electrode, the amplifier, and the compensation signal generator circuit reside on a printed circuit board, and the sensing electrode lies in a plane that is parallel with a surface of the printed circuit board.

12. The system of claim 7, wherein the electrical environmental noise includes power line interference,
  wherein the compensation signal generator circuit comprises a power line interference estimator configured to actively estimate an indication of the power line interference in the sensor signal and provide the estimated indication of the power line interference to the second input of the amplifier, and
  wherein the compensation signal generator circuit further comprises a motion noise estimator configured to estimate an indication of motion noise due to spatial motion of the animal subject relative to the sensing electrode and provide the estimated indication of motion noise to the second input of the amplifier.

* * * * *